United States Patent
Yu et al.

[11] Patent Number: 5,861,332
[45] Date of Patent: Jan. 19, 1999

[54] METHOD FOR FABRICATING CAPACITORS OF SEMICONDUCTOR DEVICES

[75] Inventors: Yong Sik Yu; Kwon Hong, both of Kyoungki-do, Rep. of Korea

[73] Assignee: Hyundai Electronics Industries Co., Ltd., Ichon-shi, Rep. of Korea

[21] Appl. No.: 883,378

[22] Filed: Jun. 26, 1997

[30] Foreign Application Priority Data

Jun. 27, 1996 [KR] Rep. of Korea .................. 1996 24269
Jun. 4, 1997 [KR] Rep. of Korea .................. 1997 23103

[51] Int. Cl.$^6$ .............................................. H01L 21/8242
[52] U.S. Cl. ........................... 438/240; 438/635; 438/768
[58] Field of Search ................................ 438/3, 240, 253, 438/635, 643, 653, 768

[56] References Cited

U.S. PATENT DOCUMENTS

| | | | |
|---|---|---|---|
| 5,489,548 | 2/1996 | Nishioka et al. | 438/768 |
| 5,554,564 | 9/1996 | Nishioka et al. | 438/240 |
| 5,567,964 | 10/1996 | Kashihara et al. | 257/310 |
| 5,585,300 | 12/1996 | Summerfelt | 438/240 |
| 5,702,970 | 12/1997 | Choi | 438/240 |
| 5,728,616 | 3/1998 | Sakao | 438/240 |

*Primary Examiner*—Chandra Chaudhari
*Attorney, Agent, or Firm*—Thelen Reid & Priest LLP

[57] ABSTRACT

A method for fabricating a capacitor of a semiconductor device, which is capable improving the chemical and thermal stability of lower electrodes. The method includes forming an interlayer insulating film provided with a contact hole over a semiconductor substrate, forming a conductive polysilicon plug in the contact hole, sequentially forming a titanium film and a titanium nitride film over the entire exposed surface of the resulting structure, selectively removing the titanium film and titanium nitride film by use of a first storage electrode mask, thereby forming a titanium film pattern and a titanium nitride film pattern, sequentially forming a ruthenium film and a ruthenium dioxide film over the entire exposed surface of the resulting structure, selectively removing the ruthenium film and the ruthenium dioxide film by use of a second storage electrode mask, thereby forming a ruthenium film pattern and a ruthenium dioxide film pattern, forming an SrO film over the entire exposed surface of the resulting structure, forming a high dielectric film over the SrO film, and forming an upper electrode over the high dielectric film.

20 Claims, 2 Drawing Sheets

METHOD FOR FABRICATING CAPACITORS OF SEMICONDUCTOR DEVICES

BACKGROUND OF THE INVENTION

1. Field of the Invention

The present invention relates to a method for fabricating capacitors of a semiconductor device, and more particularly to a method for fabricating capacitors of a semiconductor device, which is capable of achieving an improvement in chemical thermal stability, thereby enabling high integration of semiconductor devices.

2. Description of the Prior Art

The recent high integration trend of semiconductor devices inevitably involves a reduction in cell dimension. For this reason, it is necessary to form capacitors having a large capacitance while reducing the topology. In the case of a dynamic random access memory (DRAM) device constituted by one transistor and one capacitor, it is particularly important to increase the capacitance of the capacitor. In order to achieve an increase in capacitance, various methods have been proposed which are concerned with the use of a material exhibiting a high dielectric constant, the use of a dielectric film having a small thickness and the use of a lower electrode for a capacitor having an increased surface area.

By virtue of research on the application of a thin film made of $SrTiO_3$ or $(Ba, Sr)TiO_3$ (BST) exhibiting a high dielectric constant to highly dense semiconductor devices, a technique has been proposed which is concerned with the use of ruthenium dioxide ($RuO_2$) or iridium dioxide ($IrO_2$) for oxide electrodes.

Such ruthenium oxide, which is used in accordance with the above technique, has a structure having a smooth and dense surface while involving no generation of hillocks.

In accordance with this technique, however, $RuO_2$ reacts with oxygen during a deposition of BST carried out in a subsequent MOCVD BST process, so that it may be oxidized into gaseous $RuO_4$ or reduced into Ru in a vacuum at a high temperature. This is because the BST deposition is carried out at a relatively high temperature in an $O_2$ atmosphere. As a result, the surface of the resulting structure becomes rough.

SUMMARY OF THE INVENTION

An objective of the invention is to solve the above-mentioned problem and to provide a method for fabricating a capacitor of a semiconductor device, which is capable of achieving an improvement in the chemical and thermal stability of lower electrodes.

Another objective of the invention is to provide a method for fabricating a capacitor of a semiconductor device, which is capable of improving the reliability of capacitors, thereby achieving high integration of the semiconductor device.

In accordance with the present invention, these objectives are accomplished by providing a method for fabricating a capacitor for a semiconductor device, comprising the steps of: providing a semiconductor substrate; forming an interlayer insulating film provided with a contact hole over the semiconductor substrate; forming a conductive plug in the contact hole; forming a first anti-diffusion film over the entire exposed surface of the resulting structure obtained after the formation of the conductive plug; selectively removing the first anti-diffusion film by use of a first storage electrode mask, thereby forming a first anti-diffusion film pattern; sequentially forming a second anti-diffusion film and a conductive, first metal oxide film over the entire exposed surface of the resulting structure obtained after the formation of the first anti-diffusion film pattern; selectively removing the second anti-diffusion film and first metal oxide film by use of a second storage electrode mask, thereby forming a second-anti-diffusion film pattern and a first-metal oxide film pattern; forming a second metal oxide film over the entire exposed surface of the resulting structure obtained after the formation of the second-anti-diffusion film pattern and first-metal oxide film pattern; and annealing the second metal oxide film, thereby reacting the second metal oxide film with the first-metal oxide film pattern.

In accordance with the present invention, these objectives are accomplished by providing a method for fabricating a capacitor for a semiconductor device, comprising the steps of: providing a semiconductor substrate; forming an interlayer insulating film provided with a contact hole over the semiconductor substrate; forming a conductive polysilicon plug in the contact hole; sequentially forming a titanium film and a titanium nitride film over the entire exposed surface of the resulting structure obtained after the formation of the conductive polysilicon plug; selectively removing the titanium film and titanium nitride film by use of a first storage electrode mask, thereby forming a titanium film pattern and a titanium nitride film pattern; sequentially forming a ruthenium film and a ruthenium dioxide film over the entire exposed surface of the resulting structure obtained after the formation of the titanium film pattern and titanium nitride film pattern; selectively removing the ruthenium film and ruthenium dioxide film by use of a second storage electrode mask, thereby forming a ruthenium film pattern and a ruthenium dioxide film pattern; forming an SrO film over the entire exposed surface of the resulting structure obtained after the formation of the ruthenium film pattern and ruthenium dioxide film pattern; annealing the SrO film, thereby varying the SrO film with the $SrRuO_3$ film; and sequentially forming a high dielectric film and an upper electrode over the $SrRuO_3$ film and the rest portion of the SrO film which is not varied.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

FIGS. 1 to 5 illustrate sequential steps of a method for fabricating a capacitor of a semiconductor device in accordance with the present invention, respectively.

Figure 1:
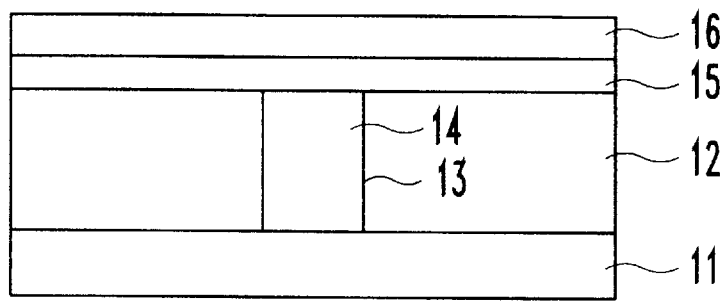
FIGS. 1 to 5 are sectional views respectively illustrating sequential steps of a method for fabricating a capacitor of a semiconductor device in accordance with the present invention, respectively.

In accordance with the method of the present invention, a semiconductor substrate 11 which has a transistor (not shown) is prepared first. An interlayer insulating film 12 is then formed over the semiconductor substrate 11, as shown in FIG. 1.

The interlayer insulating film 12 is then etched at a desired portion thereof, thereby forming a contact hole 13 for exposing a desired portion of the semiconductor substrate 11.

Thereafter, a polysilicon layer (not shown) is deposited to a thickness of about 500 to 3,000 Å over the entire exposed upper surface of the resulting structure in accordance with a chemical vapor deposition process.

Tungsten film may be used in place of the polysilicon layer.

The deposition of the polysilicon layer is carried out in such a manner that the contact hole 13 is completely buried by the polysilicon layer.

The polysilicon layer is then etched back in accordance with a full surface etch process in such a manner that it remains only in the contact hole 13. Thus, a polysilicon plug 14 is obtained.

Over the entire exposed upper surface of the resulting structure, a titanium film 15 is then deposited to a thickness of 100 to 1,000 Å.

A titanium nitride film 16 is subsequently deposited to a thickness of about 200 to 2,000 Å over the titanium film 15.

The titanium film 15 and titanium nitride film 16 are used as an anti-diffusion film.

In place of the titanium film 15 and titanium nitride film 16, the anti-diffusion film may be made of a material selected from the group consisting of Ti, Ta, WN, TiN, TaN, TiSi and TiSiN.

Figure 2:
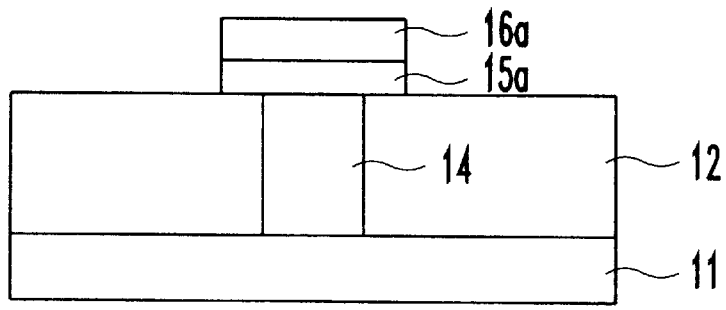

Thereafter, the titanium nitride film 16 and titanium film 15 are sequentially etched in accordance with an etch process using a first storage electrode mask, thereby forming a titanium nitride film pattern 16a and a titanium pattern 15a disposed on the polysilicon plug 14, as shown in FIG. 2.

Figure 3:
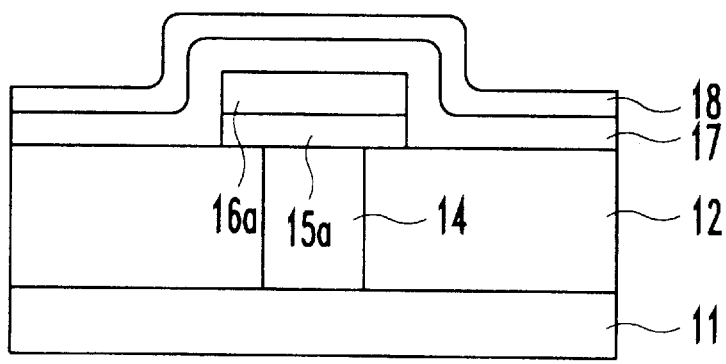

Subsequently, a ruthenium film 17 is deposited as an oxygen anti-diffusion film over the entire exposed upper surface of the resulting structure, as shown in FIG. 3, and has a thickness of about 100 to 1,000 Å.

In place of the ruthenium film 17, the oxygen anti-diffusion film may be comprised of a novel metal like iridium.

A ruthenium dioxide film 18 is then deposited as a conductive oxide film over the ruthenium film 17 and has a thickness of about 500 to 5,000 Å.

Figure 4:
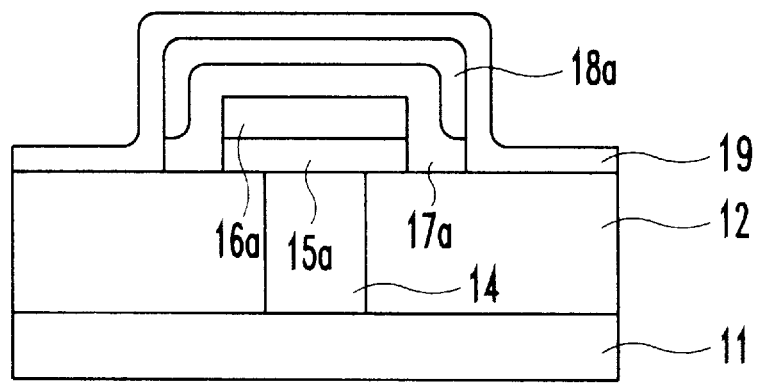
Figure 5:
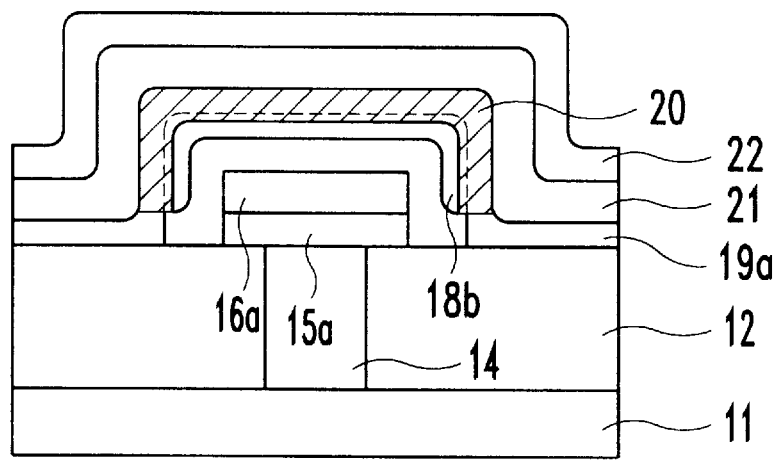

The ruthenium dioxide 18 and ruthenium film 17 are etched at desired portions thereof in accordance with an etch process using a second storage electrode mask, thereby forming a ruthenium film pattern 17a and a ruthenium dioxide film pattern 18a as shown in FIG. 4. The second storage electrode mask is configured to provide a storage electrode area larger than that provided by the first storage electrode mask.

Thus, the polysilicon plug 14, titanium film pattern 15a, titanium nitride film pattern 16a, ruthenium film pattern 17a and ruthenium dioxide film pattern 18a constitute a lower electrode which is included in a capacitor to be fabricated.

Thereafter, an SrO thin film 19 is deposited over the entire exposed upper surface of the resulting structure under a temperature of about 200° to 550° C. and has a thickness of about 100 to 500 Å. Thereafter, a rapid thermal annealing process is carried out for about 10 to 60 seconds under a temperature of about 450° to 750° C. In place of the rapid thermal annealing process, a furnace annealing process may be carried out for about 1 to 10 minute under a temperature of about 550° to 750° C. Also, in place of the rapid thermal annealing process, a BST film is formed under a temperature of about 550° to 750° C. so that it may obtain an effect which is the same as that attained when the annealing process is carried out. Thus, the ruthenium dioxide film pattern 18a and SrO film 19 react to each other, so that they are varied by SrRuO$_3$ film 20. Thus, the ruthenium dioxide film pattern 18a is only varied by the upper surface portion of the upper surface portion of the ruthenium dioxide film pattern 18a, so that only the ruthenium dioxide film pattern 18b remains.

A high dielectric film 21 made of, for example, BST, is then deposited over the SrRuO$_3$ film 20 and the portion of SrO thin film 19a which is not reacted, has a thickness of 1,000 to 5,000 Å. An SrTiO$_3$ thin film may be used in place of the BST thin film.

An upper electrode 22, which is made of a conductive oxide such as ruthenium dioxide or an anti-oxidative metal, is then deposited over the high dielectric film 21. The upper electrode 10 may be made of a material selected from a group consisting of palladium, rhodium, ruthenium, platinum, iridium, silver and other insulating metals.

As is apparent from the above description, the method of the present invention has various effects.

Specifically, the chemical and thermal stability of the lower electrode are improved in accordance with the method of the present invention because the material of the SrO thin film, which is deposited with a small thickness over the ruthenium dioxide film, is changed into SrRuO$_3$ during the deposition of the high dielectric film made of, for example, BST, carried out at a high temperature.

Since the SrO thin film is pre-deposited in accordance with the method of the present invention, it can be used as a seed layer for BST.

In accordance with the method of the present invention, it is also possible to enlarge the process window for the deposition of ruthenium dioxide and BST.

Accordingly, the method of the present invention improves the reliability of semiconductor devices, thereby achieving a high integration of those semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor for a semiconductor device, comprising the steps of:

providing a semiconductor substrate;

forming an interlayer insulating film provided with a contact hole over the semiconductor substrate;

forming a conductive plug in the contact hole;

forming a first anti-diffusion film over the entire exposed surface of the resulting structure obtained after the formation of the conductive plug;

selectively removing the first anti-diffusion film by use of a first storage electrode mask, thereby forming a first anti-diffusion film pattern;

sequentially forming a second anti-diffusion film and a conductive, first metal oxide film over the entire exposed surface of the resulting structure obtained after the formation of the first anti-diffusion film pattern;

selectively removing the second anti-diffusion film and first metal oxide film by use of a second storage electrode mask, thereby forming a second-anti-diffusion film pattern and a first-metal oxide film pattern;

forming a second metal oxide film over the entire exposed surface of the resulting structure obtained after the formation of the second-anti-diffusion film pattern and first-metal oxide film pattern; and annealing the second metal oxide film, thereby reacting the second metal oxide film with the first-metal oxide film pattern.

2. The method in accordance with claim 1, wherein the conductive plug is made of tungsten or polysilicon.

3. The method in accordance with claim 1, wherein the first anti-diffusion film has a thickness of about 100 to 1,000 Å.

4. The method in accordance with claim 1, wherein the first anti-diffusion film is made of a material selected from a group consisting of Ti, Ta, WN, TiN, TaN, TiSi and TiSiN.

5. The method in accordance with claim 1, wherein the second anti-diffusion film has a thickness of about 100 to 1,000 Å.

6. The method in accordance with claim 1, wherein the second anti-diffusion film is made of a novel metal like ruthenium or iridium.

7. The method in accordance with claim 1, wherein the first metal oxide film is comprised of a ruthenium dioxide ($RuO_2$) film which has a thickness of about 500 to 5,000 Å.

8. The method in accordance with claim 1, wherein the second metal oxide film is made of SrO which is formed under a temperature of 200° to 550° C. and has a thickness of about 100 to 500 Å.

9. The method in accordance with claim 8, wherein the SrO film is varied at a $SrRuO_3$ film by the annealing process.

10. The method in accordance with claim 9, wherein the $SrRuO_3$ film is obtained by the SrO film which is carried at a rapid thermal annealing process for about 10 to 60 second under a temperature of about 450° to 750° C.

11. The method in accordance with claim 9, wherein the $SrRuO_3$ film is obtained by the SrO film which is carried at a furnace annealing process for about 1 to 10 minute under a temperature of about 550° to 750° C.

12. The method in accordance with claim 9, wherein the $SrRuO_3$ film is obtained by the BST or $SrTiO_3$ film which is formed under the temperature of about 550° to 750° C.

13. The method in accordance with claim 12, further comprising the step of forming an upper electrode which has a thickness of about 500 to 2,000 Å over the BST or $SrTiO_3$ film.

14. The method in accordance with claim 9, wherein the upper surface portion of the first metal oxide film is only varied to the $SrRuO_3$ film.

15. The method in accordance with claim 1, which further comprises the step of:

sequentially forming a dielectric film and an upper electrode over the entire exposed surface of the resulting structure obtained after the annealing process.

16. The method in accordance with claim 1, wherein the upper electrode is made of a material selected from a group consisting of palladium, rhodium, ruthenium, platinum, iridium, silver and other insulating metals.

17. A method for fabricating a capacitor for a semiconductor device, comprising the steps of:

providing a semiconductor substrate;

forming an interlayer insulating film provided with a contact hole over the semiconductor substrate;

forming a conductive polysilicon plug in the contact hole;

sequentially forming a titanium film and a titanium nitride film over the entire exposed surface of the resulting structure obtained after the formation of the conductive polysilicon plug;

selectively removing the titanium film and titanium nitride film by use of a first storage electrode mask, thereby forming a titanium film pattern and a titanium nitride film pattern;

sequentially forming a ruthenium film and a ruthenium dioxide film over the entire exposed surface of the resulting structure obtained after the formation of the titanium film pattern and titanium nitride film pattern;

selectively removing the ruthenium film and ruthenium dioxide film by use of a second storage electrode mask, thereby forming a ruthenium film pattern and a ruthenium dioxide film pattern;

forming an SrO film over the entire exposed surface of the resulting structure obtained after the formation of the ruthenium film pattern and ruthenium dioxide film pattern;

annealing the SrO film, thereby varying the SrO film with the $SrRuO_3$ film; and sequentially forming a high dielectric film and an upper electrode over the $SrRuO_3$ film and the rest portion of the SrO film which is not varied.

18. The method in accordance with claim 17, wherein the total thickness of the titanium film and titanium nitride film ranges from about 100 Å to about 1,000 Å, the ruthenium film has a thickness of about 100 to 1,000 Å, the ruthenium dioxide film has a thickness of about 500 to 5,000 Å, the SrO film has a thickness of about 1,000 to 5,000 Å and the high dielectric film has a thickness of about 1,000 to 5,000 Å.

19. The method in accordance with claim 17, wherein the $SrRuO_3$ film is obtained by the SrO film which is carried at a rapid thermal annealing process for about 10 to 60 second under a temperature of about 450° to 750° C.

20. The method in accordance with claim 17, wherein the $SrRuO_3$ film is obtained by the SrO film which is carried at a furnace annealing process for about 1 to 10 minute under a temperature of about 550° to 750° C.

* * * * *